United States Patent
Hara et al.

(10) Patent No.: US 9,516,753 B2
(45) Date of Patent: Dec. 6, 2016

(54) WIRING SUBSTRATE AND METHOD FOR MANUFACTURING WIRING SUBSTRATE

(71) Applicant: SHINKO ELECTRIC INDUSTRIES CO., LTD., Nagano (JP)

(72) Inventors: Koichi Hara, Nagano (JP); Toshihisa Yoda, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 107 days.

(21) Appl. No.: 14/031,209

(22) Filed: Sep. 19, 2013

(65) Prior Publication Data
US 2014/0097013 A1   Apr. 10, 2014

(30) Foreign Application Priority Data
Oct. 5, 2012 (JP) ................................ 2012-223502

(51) Int. Cl.
*H05K 1/11* (2006.01)
*H05K 3/42* (2006.01)
(Continued)

(52) U.S. Cl.
CPC ......... *H05K 1/115* (2013.01); *H01L 23/49822* (2013.01); *H05K 3/423* (2013.01); *H05K 3/429* (2013.01); *H05K 3/4602* (2013.01); *H01L 23/49827* (2013.01); *H01L 2224/16225* (2013.01); *H01L 2224/32225* (2013.01); *H01L 2224/73204* (2013.01);
(Continued)

(58) Field of Classification Search
CPC ...... H01K 1/115; H05K 3/425; H05K 3/428; H05K 2201/09454; H05K 2201/09481; H05K 2201/0949; H05K 2201/09854; H05K 2201/09863; H05K 3/426; H05K 3/427

USPC .......................................... 174/264, 265, 266
See application file for complete search history.

(56) References Cited

U.S. PATENT DOCUMENTS 3,969,815 A * 7/1976 Hacke et al. ................. 174/266
2002/0160165 A1* 10/2002 Matsuda ................ H05K 1/116
174/263

(Continued)

FOREIGN PATENT DOCUMENTS

| JP | S63-053994 | 3/1988 |
|---|---|---|
| JP | 2003-048248 | 2/2003 |
| JP | 2009-038390 | 2/2009 |

OTHER PUBLICATIONS

Definition of "thickness" from www.google.com Jan. 20, 2016.*
(Continued)

*Primary Examiner* — Chau N Nguyen
*Assistant Examiner* — Roshn Varghese
(74) *Attorney, Agent, or Firm* — IPUSA, PLLC

(57) ABSTRACT

A method for manufacturing a wiring substrate includes forming a through-hole penetrating a core layer from one to another surface of the core layer, forming a first metal layer covering the one and the other surface of the core layer and an inner wall surface of the through-hole, forming a second metal layer on the first metal layer, and forming a patterned third metal layer on the second metal layer toward the one surface of the core layer along with forming a patterned fourth metal layer on the second metal layer toward the other surface of the core layer. The forming of the second metal layer includes covering the one and the other surfaces of the core layer and the first metal layer in the through-hole with the second metal layer and closing up a center part of the through-hole with the second metal layer.

16 Claims, 9 Drawing Sheets

(51) Int. Cl.
*H01L 23/498* (2006.01)
*H05K 3/46* (2006.01)

(52) U.S. Cl.
CPC .... *H01L 2224/81192* (2013.01); *H05K 3/427* (2013.01); *H05K 3/4644* (2013.01); *H05K 2201/09536* (2013.01); *H05K 2201/09854* (2013.01); *H05K 2203/0789* (2013.01); *H05K 2203/1476* (2013.01); *Y10T 29/302* (2015.01); *Y10T 29/49165* (2015.01)

(56) References Cited

U.S. PATENT DOCUMENTS

| | | | | |
|---|---|---|---|---|
| 2004/0238209 | A1* | 12/2004 | Yuri | H05K 1/056 174/257 |
| 2009/0236230 | A1* | 9/2009 | Reents | H05K 3/423 205/103 |
| 2010/0133697 | A1* | 6/2010 | Nilsson | B81C 1/00095 438/667 |
| 2011/0120762 | A1* | 5/2011 | Kawai et al. | 174/264 |
| 2011/0155439 | A1* | 6/2011 | Yamada | 174/264 |
| 2011/0209911 | A1* | 9/2011 | Ishida | H05K 1/0222 174/264 |
| 2012/0250281 | A1* | 10/2012 | Kawai | H05K 3/427 174/258 |
| 2012/0304458 | A1* | 12/2012 | Yamauchi | H05K 3/0038 29/829 |
| 2013/0313010 | A1* | 11/2013 | Rokugawa | H05K 1/0298 174/262 |

OTHER PUBLICATIONS

Office Action mailed on Jul. 26, 2016 issued with respect to the basic Japanese Patent Application No. 2012-223502.

\* cited by examiner

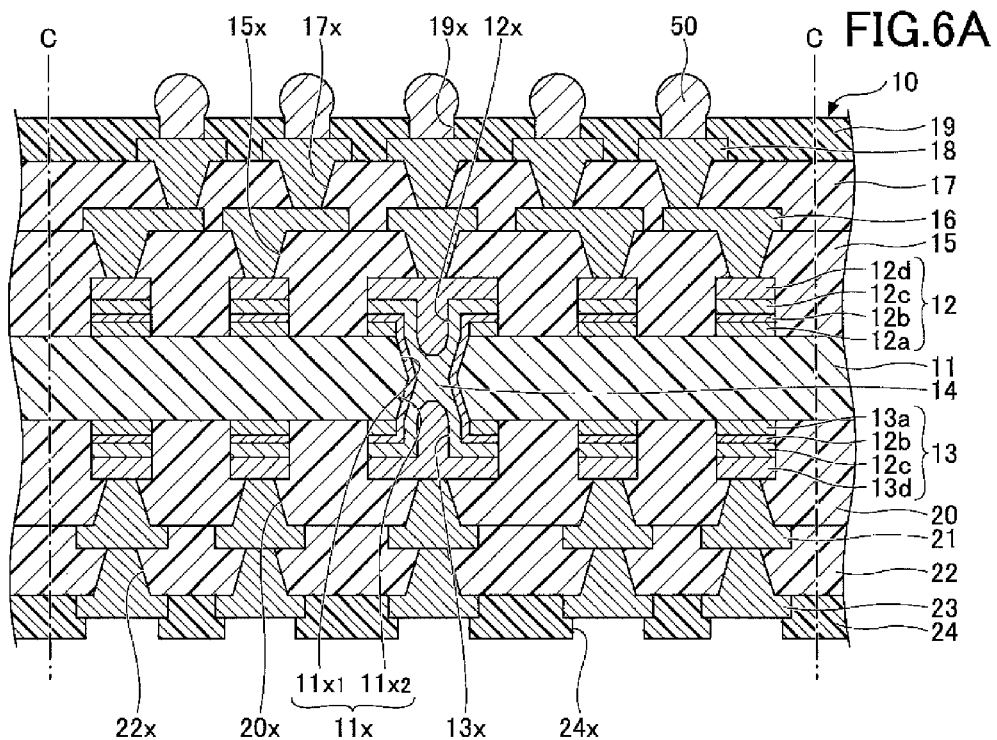
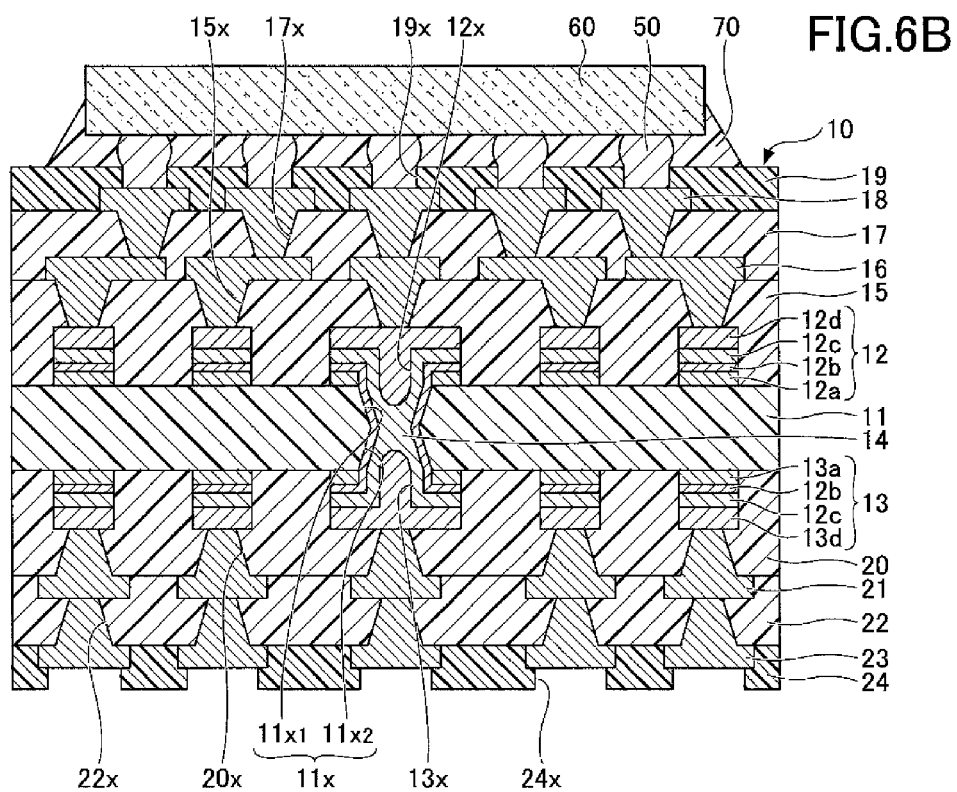

US 9,516,753 B2

WIRING SUBSTRATE AND METHOD FOR MANUFACTURING WIRING SUBSTRATE

CROSS-REFERENCE TO RELATED APPLICATIONS

This application is based upon and claims the benefit of priority of the prior Japanese Patent Application No. 2012-223502 filed on Oct. 5, 2012, the entire contents of which are incorporated herein by reference.

FIELD

The embodiments discussed herein are related to a wiring substrate and a method for manufacturing the wiring substrate.

BACKGROUND

Conventionally, there is known a wiring substrate that includes a through-wiring formed by filling a through-hole of a core layer with plating. Such wiring substrate may be manufactured by the following method (see, for example, Japanese Laid-Open Patent Publication No. 2003-46248). First, a resin plate, which is to become a core layer, is prepared. Both surfaces of the resin plate have copper foil formed thereon. Then, a hole is formed in both surfaces of the resin plate by etching the copper foil formed on both surfaces of the resin plate. Then, a through-hole is formed by performing a laser process on each of the holes formed in the surfaces of the resin plate. The through-hole has a shape in which two tapered peak parts confront each other.

Then, the through-hole is filled with plating. More specifically, at an early stage of filling the through-hole with plating, two closed-end via holes are formed by closing up a narrowest part of the through-hole. Then, unpatterned plating layers are uniformly (entirely) formed on the copper foils of both surfaces of the resin plate in addition to filling the two closed end via holes with plating (i.e. filling the entire through-hole with plating).

However, by using the above-described method, the plating layers that are uniformly formed on both surfaces of the resin plate become inevitably thick. Accordingly, in a case of forming patterns (patterning) on the copper foils or the uniformly formed plating layer by using a subtractive method, it becomes difficult to form the patterns with a fine pitch. For example, if the thickness of the copper foils are approximately 12-18 μm, the total thickness of the copper foil and the plating layer on each surface of the resin plate would become several tens of micrometers (μm). Thus, it is difficult to form fine-pitched patterns on the copper foil and the uniformly formed plating layer by using the subtractive method.

SUMMARY

According to an aspect of the invention, there is provided a method for manufacturing a wiring substrate that includes forming a through-hole penetrating a core layer from one surface of the core layer to another surface of the core layer, forming a first metal layer that covers the one and the other surface of the core layer and an inner wall surface of the through-hole, forming a second metal layer on the first metal layer, and forming a patterned third metal layer on the second metal layer toward the one surface of the core layer together with forming a patterned fourth metal layer on the second metal layer toward the other surface of the core layer, wherein the forming of the second metal layer includes covering the one and the other surfaces of the core layer and the first metal layer in the through-hole with the second metal layer and closing up a center part of the through-hole with the second metal layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 2A to 6B are schematic diagrams illustrating processes for manufacturing a wiring substrate according to an embodiment of the present invention.

DESCRIPTION OF EMBODIMENTS

Figure 1:
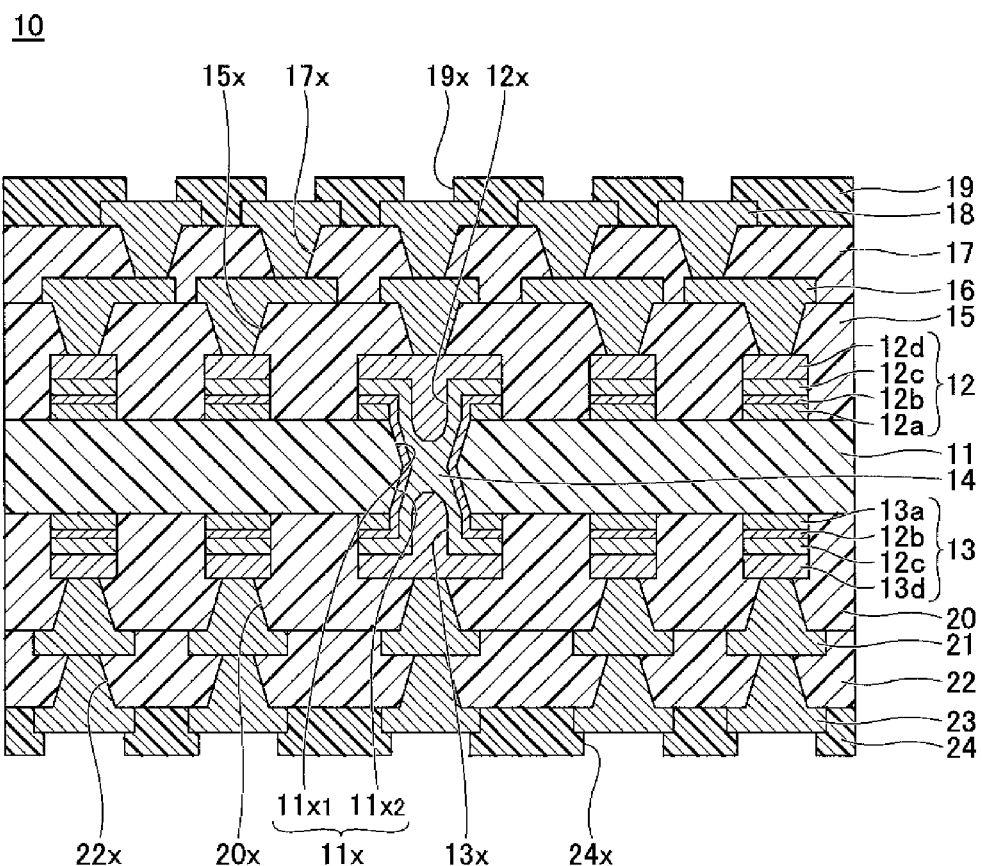
FIG. 1 is a cross-sectional view of a wiring substrate according to an embodiment of the present invention.

Next, embodiments of the present invention are described with reference to the accompanying drawings. Throughout the drawings, like components/parts are denoted with like reference numerals. Thus, detailed descriptions of like components/parts denoted with like reference numerals are omitted.

<Structure of Wiring Substrate>

First, a structure of a wiring substrate 10 according to an embodiment of the present invention is described. FIG. 1 is a cross-sectional view of the wiring substrate 10 according to an embodiment of the present invention.

With reference to FIG. 1, the wiring substrate 10 includes, for example, a core layer 11, a wiring layer 12, a wiring layer 13, a through-wiring 14, an insulating layer 15, a wiring layer 16, an insulating layer 17, a wiring layer 18, an insulating layer 20, a wiring layer 21, an insulating layer 22, a wiring layer 23, a solder resist layer 19, and a solder resist layer 24.

In describing the wiring substrate 10, for the sake of convenience, the term "one side" or the term "one surface" corresponds to a side or a surface that is positioned toward the solder resist layer 19, and the term "other side" or the term "other surface" corresponds to a side or surface that is positioned toward the solder resist layer 24.

The wiring substrate 10 has the wiring layer 12 formed on one surface of the core layer 11, and the wiring layer 13 formed on the other surface of the core layer 11. The wiring layer 12 and the wiring layer 13 are electrically connected to each other by the through-wiring 14 formed in a through-hole 11x penetrating the core layer 11 from the one surface of the core layer 11 to the other surface of the core layer 11. Each of the wiring layer 12 and the wiring layer 13 is patterned into a predetermined shape from a plan view (plan-view shape). It is to be noted that the wiring layer 12 is a representative example of a first wiring layer according to an embodiment of the present invention, and the wiring layer 13 is a representative example of a second wiring layer according to an embodiment of the present invention.

The core layer 11 may be, for example, a so-called glass epoxy resin substrate having an epoxy type resin impregnated in a glass cloth. A substrate having an insulating resin (e.g., epoxy type resin) impregnated in a woven or non-woven fiber (e.g., glass fiber, carbon fiber, aramid fiber) may be used as the core layer 11. The thickness of the core layer 11 may be, for example, approximately 60 μm to 200 μm. The core layer 11 includes the through-hole 11x penetrating the core layer 11 in a thickness direction of the core layer 11. It is to be noted that the materials constituting the core layer 11 (e.g., glass cloth) are omitted from the accompanying drawings.

The through-hole 11x includes a first hole $11x_1$ formed in the one surface of the core layer 11 and a second hole $11x_2$ formed in the other surface of the core layer 11. The first hole $11x_1$ has a circular truncated shape and includes an opening toward the one surface of the core layer 11 and a first peak part formed inside the core layer 11. In the first hole $11x_1$, the opening towards the one surface of the core layer 11 has a greater area than an area of the first peak part. Further, the second hole $11x_2$ also has a circular truncated shape and includes an opening toward the other surface of the core layer 11 and a second peak part formed inside the core layer 11. In the second hole $11x_2$, the opening toward the other surface of the core layer 11 has a greater area than an area of the second peak part. The through-hole 11x is formed by the first and second peak parts of the first and second holes $11x_1$, $11x_2$ communicating at a part inside the core layer 11 (e.g., vicinity of a center part of the core layer 11 in a thickness direction of the core layer 11). It is to be noted that a portion in which the first and second peak parts of the first and second holes $11x_1$, $11x_2$ communicate may be hereinafter referred to as "peak communicating part".

In other words, the through-hole 11x has an hourglass-like shape. In this embodiment, the hourglass-like shape has cross sections that continuously become smaller (cross section in a plan direction) from the opening toward the one surface of the core layer 11 to the first peak part of the first hole $11x_1$ and from the opening toward the other surface of the core layer 11 to the second peak part of the second hole $11x_2$, respectively. The peak communicating part is a portion of the through-hole 11x having the smallest cross-sectional area (small diameter part).

That is, the cross section of the through-hole 11x (cross section in a thickness direction) has a slope surface extending from the opening toward the one surface of the core layer 11 to the small diameter part (peak communicating part) provided substantially at a center of the through-hole 11x. Further, the cross section of the through-hole 11x (cross section in a thickness direction) has a slope surface extending from the opening toward the other surface of the core layer 11 to the small diameter part (peak communicating part) provided substantially at a center of the through-hole 11x.

In the through-hole 11x, the opening toward the one surface of the core layer 11 and the opening toward the other surface of the core layer 11 may have a diameter of, for example, approximately 70 μm to 100 μm, respectively. Further, the peak communicating part of the through-hole 11x may have a diameter of, for example, approximately 40 μm to 75 μm.

It is, however, to be noted that the shapes of the first and second holes $11x_1$, $11x_2$ are not limited to the circular truncated shape. Thus, for example, the cross-sectional shape (cross sections in the plan direction) of the opening toward the one surface of the core layer 11, the opening toward the other surface of the core layer 11, and the peak communicating part may be an elliptical shape or another shape.

Although the peak communicating part is positioned at the vicinity of the center of the core layer 11 in the thickness direction of the core layer 11, the peak communicating part may deviate more toward the one side or the other side of the core layer with respect to the vicinity of the center of the core layer 11. An axis part of the first hole $11_{x1}$ and an axis part of the second hole $11_{x2}$ may slightly deviate from each other in a horizontal direction.

A cross section (cross section in the thickness direction) of an inner wall surface of the through-hole 11x extending from the opening toward the one side to the peak communicating part and a cross section (cross section in the thickness direction) of an inner wall surface of the through-hole 11x extending from the opening toward the other side to the peak communicating part may have a straight linear shape or a curved linear shape, respectively.

The wiring layer 12 includes a layered structure having a first metal foil 12a, a first metal layer 12b, a second metal layer 12c, and a third metal layer 12d layered on the one surface of the core layer 11 in this order. The wiring layer 13 includes a layered structure having a second metal foil 13a, the first metal layer 12b, the second metal layer 12c, and a fourth metal layer 13d layered on the other surface of the core layer 11 in this order.

In the through-hole 11x and a peripheral part of the through-hole 11x, the first and second metal layers 12b, 12c are formed continuously from the one surface of the core layer 11 to the other surface of the core layer 11 by way of the through-hole 11x. More specifically, in the through-hole 11x and the peripheral part of the through-hole 11x, the first metal layer 12b covers the inner wall surface of the through-hole 11x and extends from the peak communicating part to the one and the other surfaces of the core layer 11. Further, the first metal layer 12b covers the first metal foil 12a on the one surface of the core layer 11 and covers the second metal foil 13a on the other surface of the core layer 11.

Further, in the through-hole 11x, the second metal layer 12c covers the first metal layer 12b covering the inner wall surface of the through-hole 11x and closes up a center part of the through-hole 11x without filling the entire through-hole 11x. A first recess part 12x is formed in the through-hole 11x and on the through-hole 11x interposed by the second metal layer 12c. The first recess part 12x is open toward the one surface of the core layer 11 and has a bottom part formed by the second metal layer 12c closing up the center part of the through-hole 11x. Further, a second recess part 13x is formed in the through-hole 11x and on the through-hole 11x interposed by the second metal layer 12c. The second recess part 13x is open toward the other surface of the core layer 11 and has a bottom part formed by the second metal layer 12c closing up the center part of the through-hole 11x.

That is, the cross section of the second metal layer 12c in the through-hole 11x has an X-letter shape. The cross section of the second metal layer 12c need only be similar to the shape of the letter X but does not need to be exactly the same as the shape of the letter X. That is, the diagonal lines constituting the X-letter shape does not need to be straight lines but may be curved lines or a combination of a straight line and a curved line.

In the through-hole 11x and the peripheral part of the through-hole 11x, the third metal layer 12d covers the second metal layer 12c toward the one surface of the core layer 11 and fills the first recess part 12x. The third metal layer 12d has an upper surface that is substantially flat. Further, in the through-hole 11x and in the peripheral part of the through-hole 11x, the fourth metal layer 13d covers the second metal layer 12c toward the other surface of the core layer 11 and fills the second recess part 13x. The fourth metal layer 13d has a lower surface that is substantially flat.

A part in the through-hole 11x, which is constituted by the first metal layer 12b, the second metal layer 12c, the third metal layer 12d, and the fourth metal layer 13d, corresponds to the through-wiring 14. For example, copper (Cu) may be used as the material of the first metal foil 12a, the first metal layer 12b, the second metal layer 12c, the third metal layer 12d, the second metal foil 13a, and the fourth metal layer 13d.

The thickness of each of the first and second metal foils 12a, 13a may be, for example, approximately 2 μm to 3 μm. The thickness of the first metal layer 12b may be, for example, approximately 0.5 μm to 1 μm. The thickness of the second metal layer 12c may be, for example, approximately 5 μm to 10 μm. The thickness of each of the third and fourth metal layers 12d, 13d may be, for example, approximately 10 μm to 20 μm.

The insulating layer 15 is formed on the one surface of the core layer 11 to cover the wiring layer 12. For example, an insulating resin having an epoxy type resin as a main component may be used as the material of the insulating layer 15. The insulating layer 15 may include a filler such as silica ($SiO_2$). The thickness of the insulating layer 15 may be, for example, approximately 30 μm to 70 μm.

The wiring layer 16 is formed toward one side of the insulating layer 15. The insulating layer 15 includes a via hole 15x penetrating the insulating layer 15 and exposing one surface of the wiring layer 12. The wiring layer 16 includes a via wiring that fills the via hole 15x and a wiring pattern that is formed on one surface of the insulating layer 15. The via hole 15x is open toward the insulating layer 17 (opening part) and has a bottom surface formed by the one surface of the wiring layer 12 (bottom part). The via hole 15x includes a recess part having a circular truncated cone shape in which the opening part of the via hole 15x has an area larger than the area of the bottom surface of the via hole 15x. For example, copper (Cu) may be used as the material of the wiring layer 16. The thickness of the wiring layer 16 may be, for example, approximately 10 μm to 30 μm.

The insulating layer 17 is formed on the one surface of the insulating layer 15 and covers the wiring layer 16. The insulating layer 17 may be made with the same material as that of the insulating layer 15 and have the same thickness as the insulating layer 15. The insulating layer 17 may include a filler such as silica ($SiO_2$).

The wiring layer 18 is formed toward one side of the insulating layer 17. The insulating layer 17 has a via hole 17x penetrating therethrough and exposing one surface of the wiring layer 16. The wiring layer 18 includes a via wiring that fills the via hole 17x and a wiring pattern that is formed on one surface of the insulating layer 17. The via hole 17x is open toward the solder resist layer 19 (opening part) and has a bottom surface formed by the one surface of the wiring layer 16 (bottom part). The via hole 17x includes a recess part having a circular truncated cone shape in which the opening part of the via hole 17x has an area larger than the area of the bottom surface of the via hole 17x. The recess part of the via hole 17x has a via wiring formed therein. For example, the material and the thickness of the wiring layer 18 may be the same as those of the wiring layer 16.

The solder resist layer 19 is formed on the one surface of the insulating layer 17 and covers the wiring layer 18. The solder resist layer 19 may be formed of, for example, a photosensitive resin. The thickness of the solder resist layer 19 may be, for example, approximately 30 μm to 70 μm.

The solder resist layer 19 is formed including an opening part 19x and exposing a part of the wiring layer 18 in the opening part 19x. The wiring layer 18 may also be referred to as a first pad. The wiring layer 18, which has a part exposed in the opening part 19x, functions as an electrode pad that is to be electrically connected to, for example, a semiconductor chip (not illustrated).

Alternatively, the solder resist layer 19 may be formed exposing the entire wiring layer 18. In a case where the solder resist layer 19 is formed exposing the entire wiring layer 18, the solder resist layer 19 may be provided, so that a side surface the solder resist layer 19 and a side surface of the wiring layer 18 contact each other. Alternatively, in a case where the solder resist layer 19 covers the entire wiring layer 18, the solder resist layer 19 may be provided, so that a space is formed between the side surface of the wiring layer 18 and the side surface of the solder resist layer 19.

According to necessity, a metal layer may be formed on the one surface of the wiring layer (first pad) 18 exposed in the bottom part of the opening part 19x. Alternatively, an anti-oxidation process such as an OSP (Organic Solderability Preservative) process may be performed on the one surface of the wiring layer 18 (first pad). The metal layer may be, for example, a gold layer (Au), a nickel/gold (Ni/Au) layer (i.e. metal layer including a Ni layer and a Au layer layered in this order), or a nickel/palladium/gold (Ni/Pd/Au) layer (i.e. metal layer including a Ni layer, a Pd layer, and a Au layer layered in this order). The thickness of the metal layer may be, for example, approximately 0.03 μm to 10 μm. Further, an external connection terminal such as a solder ball may be formed on one surface of the first pad 18.

The wiring pattern constituting the wiring layer 18 may be extended and formed on the one surface of the insulating layer 17, and the opening part 19x may be formed on the extended part of the wiring pattern on the one surface of the insulating layer 17. In other words, the opening part 19x may be formed in a portion of the wiring layer 18 other than a portion in which the via hole 17x is formed.

The insulating layer 20 is formed on the other surface of the core layer 11 and covers the wiring layer 13. For example, the material and the thickness of the insulating layer 20 may be the same as those of the insulating layer 15. The insulating layer 20 may include a filler such as silica ($SiO_2$).

The wiring layer 21 is formed toward the other side of the insulating layer 20. The insulating layer 20 has a via hole 20x penetrating therethrough and exposing the other surface of the wiring layer 13. The wiring layer 21 includes a via wiring that fills the via hole 20x and a wiring pattern that is formed on the other surface of the insulating layer 20. The via hole 20x is open toward the insulating layer 22 (opening part) and has a bottom surface formed by the other surface of the wiring layer 13 (bottom part). The via hole 20x includes a recess part having a circular truncated cone shape in which the opening part of the via hole 20x has an area larger than the area of the bottom surface of the via hole 20x. For example, the material and the thickness of the wiring layer 21 may be the same as those of the wiring layer 16.

The insulating layer 22 is formed on the other surface of the insulating layer 20 and covers the wiring layer 21. For example, the material and the thickness of the insulating layer 22 may the same as those of the insulating layer 15. The insulating layer 22 may include a filler such as silica ($SiO_2$).

The wiring layer 23 is formed toward the other side of the insulating layer 22. The insulating layer 22 has a via hole 22$x$ penetrating therethrough and exposing the other surface of the wiring layer 21. The wiring layer 23 includes a via wiring that fills the via hole 22$x$ and a wiring pattern that is formed on the other surface of the insulating layer 22. The via hole 22$x$ is open toward the solder resist layer 24 (opening part) and has a bottom surface formed by the other surface of the wiring layer 21 (bottom part). The via hole 22$x$ includes a recess part having a circular truncated cone shape in which the opening part of the via hole 22$x$ has an area larger than the area of the bottom surface of the via hole 22$x$. The recess part of the via hole 22$x$ has a via wiring formed therein. For example, the material and the thickness of the wiring layer 23 may be the same as those of the wiring layer 16.

The solder resist layer 24 is formed on the other surface of the insulating layer 22 and covers the wiring layer 23. For example, the material and the thickness of the solder resist layer 24 may be the same as those of the solder resist layer 19.

The solder resist layer 24 includes an opening part 24$x$. A part of the wiring layer 23 is exposed in the opening part 24$x$. The wiring layer 23 may also be referred to as a second pad. The wiring layer 23, which has a part exposed in the opening part 24$x$, functions as an electrode pad that is to be electrically connected to, for example, a mounting substrate such as a motherboard (not illustrated). A plan-view shape of the second pad 23 is larger than a plan-view shape of the first pad 18. Further, the pitch between the second pads 23 is larger than the pitch between the first pads 18.

According to necessity, a metal layer may be formed on the other surface of the wiring layer (second pad) 23. Alternatively, an anti-oxidation process such as an OSP (Organic Solderability Preservative) process may be performed on the other surface of the wiring layer (second pad) 23. The metal layer may be, for example, a gold layer (Au), a nickel/gold (Ni/Au) layer (i.e. metal layer including a Ni layer and a Au layer layered in this order), or a nickel/palladium/gold (Ni/Pd/Au) layer (i.e. metal layer including a Ni layer, a Pd layer, and a Au layer layered in this order). The thickness of the metal layer may be, for example, approximately 0.03 μm to 10 μm. Further, an external connection terminal (e.g., solder ball, lead pin) may be formed on other surface of the second pad 23.

The wiring pattern constituting the wiring layer 23 may be extended and formed on the other surface of the insulating layer 22, and the opening part 24$x$ may be formed on the extended part of the wiring pattern on the other surface of the insulating layer 22. In other words, the opening part 24$x$ may be formed in a portion of the wiring layer 23 other than a portion in which the via hole 22$x$ is formed.

[Method for Manufacturing Wiring Substrate]

Next, a method for manufacturing a wiring substrate according to an embodiment of the present invention is described. FIGS. 2A to 6B are schematic diagrams illustrating processes for manufacturing a wiring substrate according to an embodiment of the present invention.

First, a layered substrate is prepared. The layered substrate includes the core layer 11 that has a first metal foil 12P formed on the one surface of the core layer 11 and a second metal foil 13P formed on the other surface of the core layer 11. The first and second metal foils 12P, 13P are unpatterned metal foils that are uniformly formed on the one and the other surfaces of the core layer 11, respectively.

The core layer 11 may be, for example, a so-called glass epoxy resin substrate having an epoxy type resin impregnated in a glass cloth. A substrate having an insulating resin (e.g., epoxy type resin) impregnated in a woven or non-woven fiber (e.g., glass fiber, carbon fiber, aramid fiber) may be used as the core layer 11. The thickness of the core layer 11 may be, for example, approximately 60 μm to 200 μm.

Each of the first and second metal foils 12P, 13P may be, for example, a copper foil. The thickness of each of the first and second metal foils 12P, 13P may be, for example, approximately 12 μm to 18 μm. It is, however, preferable to reduce the thickness of each of the first and second metal foils 12P, 13P to approximately 2 μm to 3 μm by using, for example, an etching method. In a case where the first and second metal foils 12P, 13P are copper foils, the first and second metal foils 12P, 13P may be etched by using, for example, an etching liquid of sulfuric acid and hydrogen peroxide or an etching liquid of chloride persulfate.

The objectives of the reduction of the thicknesses of the first and second metal foils 12P, 13P include facilitating a laser process performed in a subsequent process, reducing the size of the burrs (described below) created at the edge parts of the first and second metal foils 12P, 13P that are processed, and forming fine-pitched wiring layers 12, 13. The first and second metal foils 12P, 13P are patterned in a subsequent process and become first and second metal foils 12$a$, 13$a$, respectively.

Figure 2A:
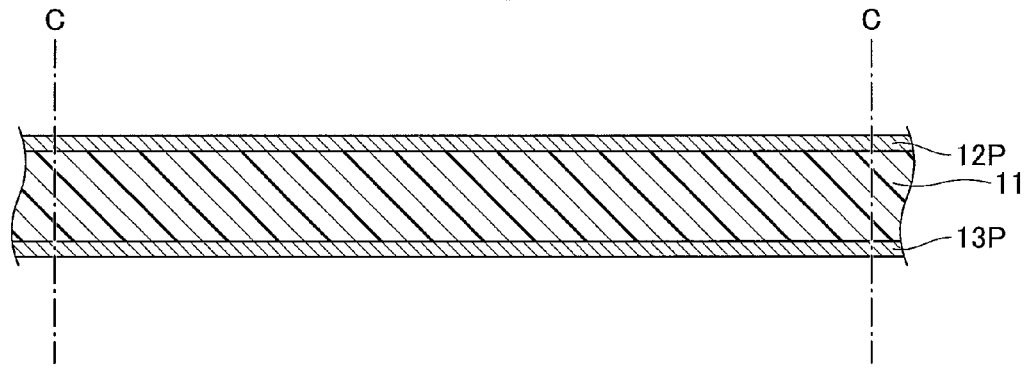
Figure 2B:
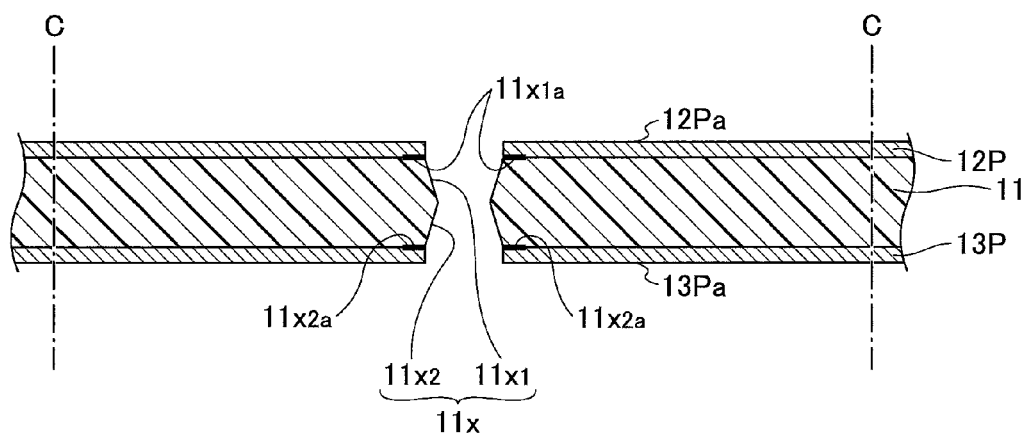

Then, in the process illustrated in FIG. 2B, the through-hole 11$x$ that penetrates the core layer 11, the first metal foil 12P, and the second metal foil 13P is formed by a laser processing method using, for example, a $CO_2$ laser. In forming the through-hole 11$x$, first, a first hole $11_{x1}$ is formed in the one surface of the core layer 11. The first hole $11_{x1}$ is formed by radiating a laser to the one surface of the core layer 11 by way of the first metal foil 12P.

Then, a second hole $11_{x2}$ is formed in a part of the other surface of the core layer 11 corresponding to the first hole $11_{x1}$. The second hole $11_{x2}$ is formed by radiating a laser to the other surface of the core layer 11 by way of the second metal foil 13P. Thereby, the through-hole 11$x$ is formed in which a peak part of the first hole $11_{x1}$ and a peak part of the second hole $11_{x2}$ communicate with each other at the vicinity of a center part of the core layer 11 in a thickness direction. As long as the through-hole 11$x$ is formed, the first hole $11_{x1}$ doe snot need to penetrate the core layer 11.

The first hole $11_{x1}$ has a circular truncated cone shape in which the area of an opening part formed in the one surface of the core layer 11 is larger than the area of the peak part formed in the core layer 11. Further, the second hole $11_{x2}$ has a circular truncated cone shape in which the area of an opening part formed in the other surface of the core layer 11 is larger than the area of the peak part formed in the core layer 11. In other words, the through-hole 11$x$ has an hourglass-like shape.

It is, however, to be noted that the shapes of the first and second holes $11x_1$, $11x_2$ are not limited to the circular truncated shape. Thus, for example, the cross-sectional shape (cross sections in the plan direction) of the opening toward the one surface of the core layer 11, the opening toward the other surface of the core layer 11, and the peak communicating part may be an elliptical shape or another shape. Although the peak communicating part is positioned at the vicinity of the center of the core layer 11 in the thickness direction of the core layer 11, the peak communicating part may deviate more toward the one side or the other side of the core layer from the vicinity of the center of the core layer 11.

A cross section (cross section in the thickness direction) of an inner wall surface of the through-hole 11$x$ extending from the opening toward the one side to the peak communicating part and a cross section (cross section in the thickness direction) of an inner wall surface of the through-hole 11x extending from the opening toward the other side to the peak communicating part may have a straight linear shape or a curved linear shape, respectively.

After forming the through-hole 11x with the laser process method, a burr(s) may be created at an edge of the opening part toward the one side of the through-hole 11x. The burr is an end part of the first metal foil 12P that projects as a canopy inside the through-hole 11x. Likewise, a burr(s) may be created at an edge of the opening part toward the other side of the through-hole 11x. The burr is an end part of the second metal foil 13P that projects as a canopy inside the through-hole 11x. In some cases, the burr may be folded over, or a material of the first and second metal foils 12P, 13P melted by the laser process method may adhere to an end part of the burr.

In a case where the burr is created, it is preferable to remove the burr by, for example, etching the burr with an etching liquid of sulfuric acid and hydrogen peroxide or an etching liquid of chloride persulfate. Alternatively, the burr may be removed by, for example, buffing, blasting, or high-pressure spray cleaning. As described above, it is preferable to reduce the thicknesses of the first and second metal foils 12P, 13P in order to facilitate the removal of the burr.

During the removal of the burr, a part of the first metal foil 12P encompassing the opening part of the through-hole 11x in the one surface of the core layer 11 may be annularly removed together with the burr. Thus, a part 11x1a of the one surface of the core layer 11 may become exposed in an annular shape. However, the exposure of the part 11x1a of the one surface of the core layer 11 is not a significant problem. Likewise, a part of the second metal foil 13P encompassing the opening part of the through-hole 11x in the other surface of the core layer 11 may be annularly removed together with the burr. Thus, a part 11x2a of the other surface of the core layer 11 may become exposed in an annular shape. However, the exposure of the part 11x2a of the other surface of the core layer 11 is not a significant problem.

It is preferable to perform a surface treating process on the one surface of the first metal foil 12P and the other surface of the second metal foil 13P between the process illustrated in FIG. 2A and the process illustrated in FIG. 2B in order to facilitate the laser process method.

One example of the surface treating process is a blackening process. The blackening process is an oxidation process performed on a metal foil surface by using, for example, sodium chlorite. The blackening process is one type of roughening process.

By the blackening process, an oxide film is formed on each of the one surface of the first metal foil 12P and the other surface of the second metal foil 13P. The oxide film includes fine-sized protrusions and recesses of approximately 1 μm. That is, a roughened surface 12Pa, 13Pa of the oxide film is formed on the one surface of the first metal foil 12P and the other surface of the second metal foil 13P, respectively. The roughened surface of the oxide film appears as a blackish or a brownish color.

Because the blackish or brownish oxide film can easily absorb light waves of the laser radiated thereto in a subsequent process, the laser process can be facilitated. For example, in a case where a $CO_2$ laser having an infrared wavelength is used, the blackish or brownish oxide film can absorb light of a wide wave band including, for example, ultraviolet light, visible light, and infrared light. Therefore, the laser process can be facilitated. In a case where burr is removed by etching as described above, the blackish or brownish oxide film is removed together with the burr. It is to be noted that a process other than the blackening process may be used as long as the process facilitates the absorbing of a light wave of a laser radiated in a subsequent process.

Figure 2C:
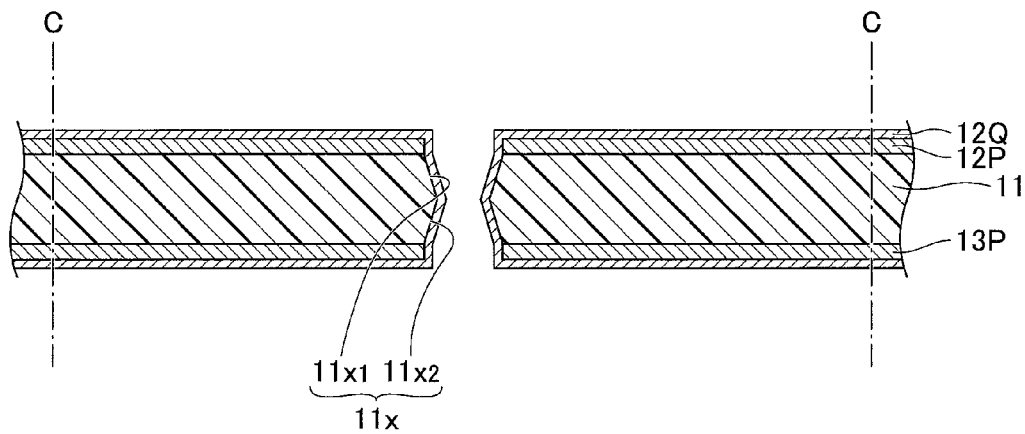

Then, after a desmearing process is performed according to necessity, the wiring layers 12, 13 are formed in the processes illustrated in FIGS. 2C-4A. More specifically, first, a metal layer 12Q that covers the first metal foil 12P, an inner wall surface of the through-hole 11x, and the second metal foil 13P is formed as illustrated in FIG. 2C. The first metal layer 12Q may be formed by, for example, an electroless plating method. For example, copper (Cu) may be used as the material of the first metal layer 12Q. The thickness of the first metal layer 12Q may be, for example, approximately 0.5 μm to 1 μm. The first metal layer 12Q is used as a power-feeding layer during a subsequently performed electroplating process. The first metal layer 12Q is etched to finally become the first metal layer 12b.

Figure 3A:
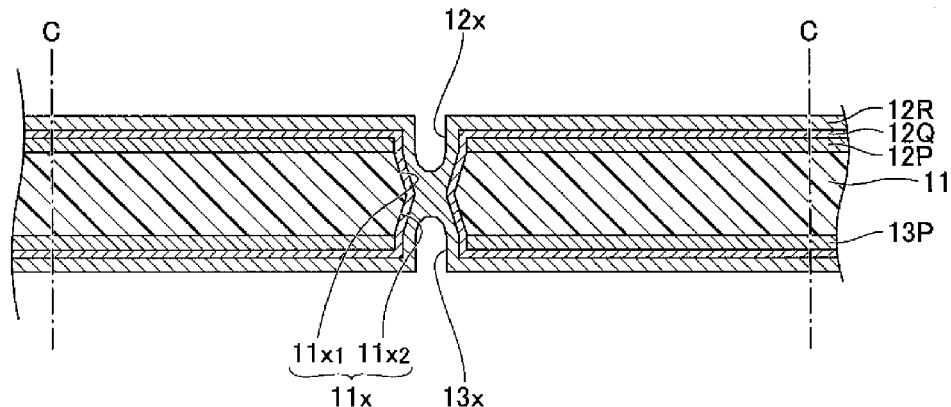

Then, as illustrated in FIG. 3A, a second metal layer 12R is formed on the first metal layer 12Q. The second metal layer 12R is formed by performing an electroplating method that uses the first metal layer 12Q as a power-feeding layer. The second metal layer 12R is uniformly (entirely) formed on the first metal layer 12Q on the one surface of the core layer 11. Further, the second metal layer 12R is uniformly (entirely) formed on the first metal layer 12Q on the other surface of the core layer 11. Further, the second metal layer 12R covers the first metal layer 12Q covering the inner wall surface of the through-hole 11x and closes up a center part of the through-hole 11x without entirely filling the through-hole 11x. For example, copper (Cu) may be used as the material of the second metal layer 12R. The thickness of the second metal layer 12R formed on the one and the other surfaces of the core layer 11 may be, for example, approximately 5 μm to 10 μm. The second metal layer 12R is etched to finally become the second metal layer 12c.

Although the vicinity of the center part of the through-hole 11x is closed up by the second metal layer 12R, the first recess part 12x is formed in the through-hole 11x and on the through-hole 11x interposed by the second metal layer 12R. The first recess part 12x is open toward the one surface of the core layer 11 and has a bottom part formed by the second metal layer 12R closing up the center part of the through-hole 11x. Further, the second recess part 13x is formed in the through-hole 11x and on the through-hole 11x interposed by the second metal layer 12R. The second recess part 13x is open toward the other surface of the core layer 11 and has a bottom part formed by the second metal layer 12R closing up the center part of the through-hole 11x. In other words, the cross section of the second metal layer 12R in the through-hole 11x has an X-letter shape.

Figure 3B:
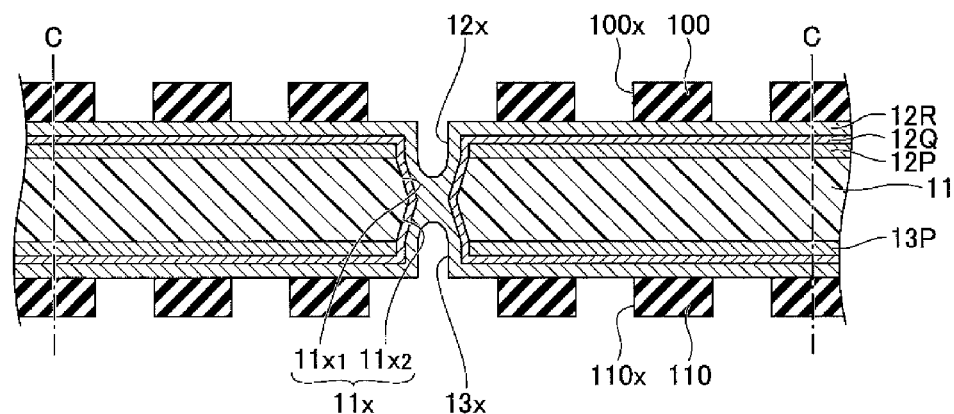

Then, as illustrated in FIG. 3B, a first resist layer 100, which includes a first opening part(s) 100x corresponding to the wiring layer 12, is formed on the second metal layer 12R toward the one surface of the core layer 11. Further, a second resist layer 110, which includes a second opening part(s) 110x corresponding to the wiring layer 13, is formed on the second metal layer 12R toward the other surface of the core layer 11. For example, dry film resists may be used to form the first and second resist layers 100, 110. The first and second opening parts 100x, 110x may be formed by performing a patterning process on the dry film resists.

Figure 3C:
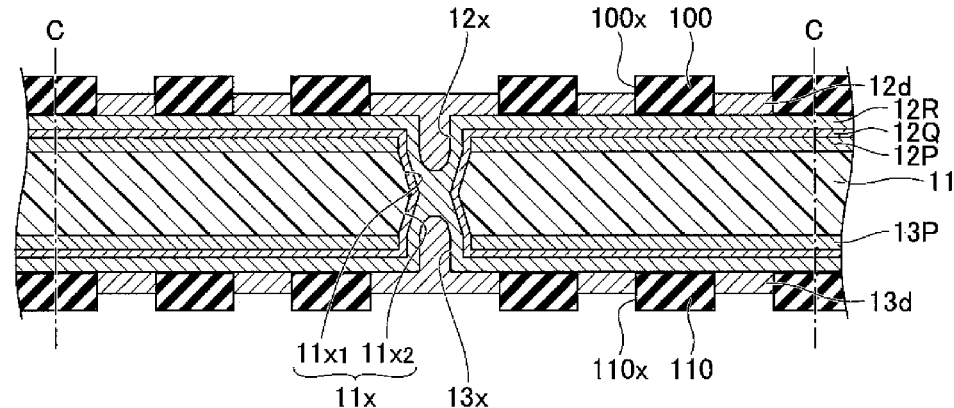

Then, as illustrated in FIG. 3C, a third metal layer 12d is formed on the second metal layer 12R exposed in the first opening part 100x. The third metal layer 12d is formed by using an electroplating method using the first metal layer 12Q as a power-feeding layer. Further, a fourth metal layer 13d is formed on the second metal layer 12R exposed in the second opening part 110x. The fourth metal layer 13d is formed by using an electroplating method using the first metal layer 12Q as a power-feeding layer. For example, copper (Cu) may be used as the material of the third and fourth metal layers 12d, 13d. The thickness of each of the third and fourth metal layers may be, for example, approximately 10 μm to 20 μm.

The third metal layer 12d fills the first recess part 12x formed toward a front surface of the through-hole 11x (toward the first metal foil 12P) in the process illustrated in FIG. 3B. The fourth metal layer 13d fills the second recess part 13x formed toward the front surface of the through-hole 11x (toward the second metal foil 13P) in the process illustrated in FIG. 3B. Further, the third metal layer 12d has an upper surface that is substantially flat, and the fourth metal layer 13d has a bottom surface that is substantially flat. Although an electroplating method is used in the processes illustrated in FIGS. 3A and 3C, the conditions for performing the electroplating method (e.g., composition of a plating liquid used for the electroplating method) in each of the processes illustrated in FIGS. 3A and 3C may be changed. For example, the plating conditions for the process of FIG. 3A may be set by placing importance on appropriately filling the through-hole 11x, and the plating conditions for the process of FIG. 3C may be set by placing importance on attaining flatness for third and fourth metal layers 12d, 13d.

Figure 4A:
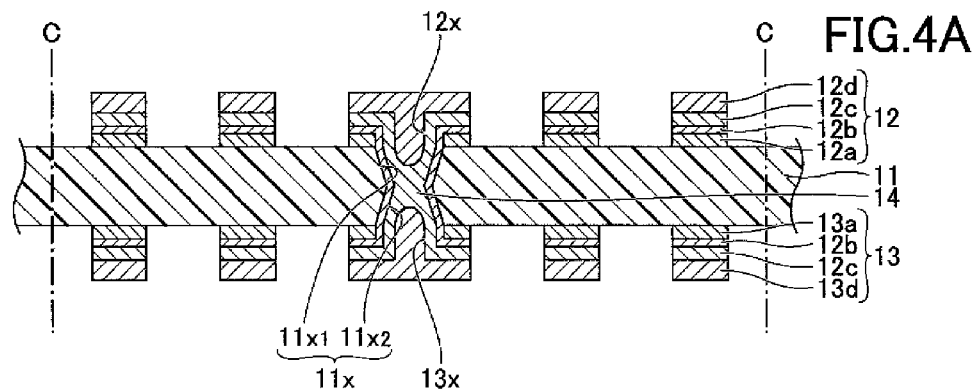

Then, as illustrated in FIG. 4A, after the removal of the first resist layer 100, a portion of the third metal layer 12d becomes exposed. Then, the first metal foil 12P, the first metal layer 12Q, and the second metal layer 12R corresponding to the exposed portion of the third metal layer 12d are removed (etched) by using the third metal layer 12d as a mask. Likewise, after the removal of the second resist layer 110, a portion of the third metal layer 13d becomes exposed. Then, the second metal foil 13P, the first metal layer 12Q, and the second metal layer 12R corresponding to the exposed portion of the fourth metal layer 13d are removed (etched) by using the fourth metal layer 13d as a mask.

Thereby, a wiring layer 12, which includes the first metal foil 12a, the first metal layer 12b, the second metal layer 12c, and the third metal layer 12d, is formed with a predetermined plan-view shape on the one surface of the core layer 11. Further, a wiring layer 13, which includes the second metal foil 13a, the first metal layer 12b, the second metal layer 12c, and the fourth metal layer 13d, is formed with a predetermined plan-view shape on the other surface of the core layer 11.

Figure 4B:
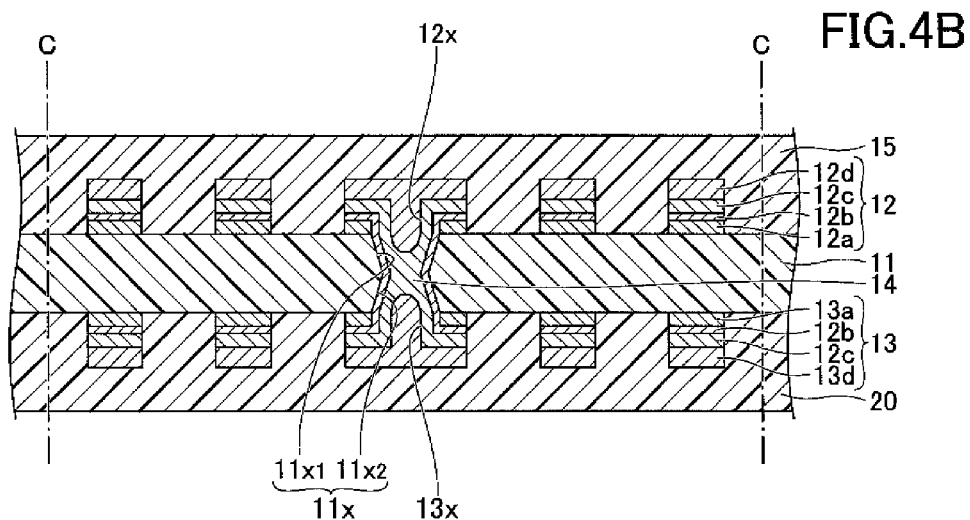

Then, in the process illustrated in FIG. 4B, an insulating layer 15 is formed on the one surface of the core layer 11 by laminating an insulating resin film (e.g., epoxy type resin) that covers the wiring layer 12. Further, an insulating layer 20 is formed on the other surface of the core layer 11 by laminating an insulating resin film (e.g., epoxy type resin) that covers the wiring layer 13. Alternatively, instead of laminating an insulating resin film, the insulating layers 15, 20 may be formed by applying a liquid or paste-like resin and curing the liquid or paste-like resin. The thickness of each of the insulating layers 15, 20 may be, for example, approximately 30 μm to 70 μm. Each of the insulating layers 15, 20 may include a filler such as silica ($SiO_2$).

Figure 4C:
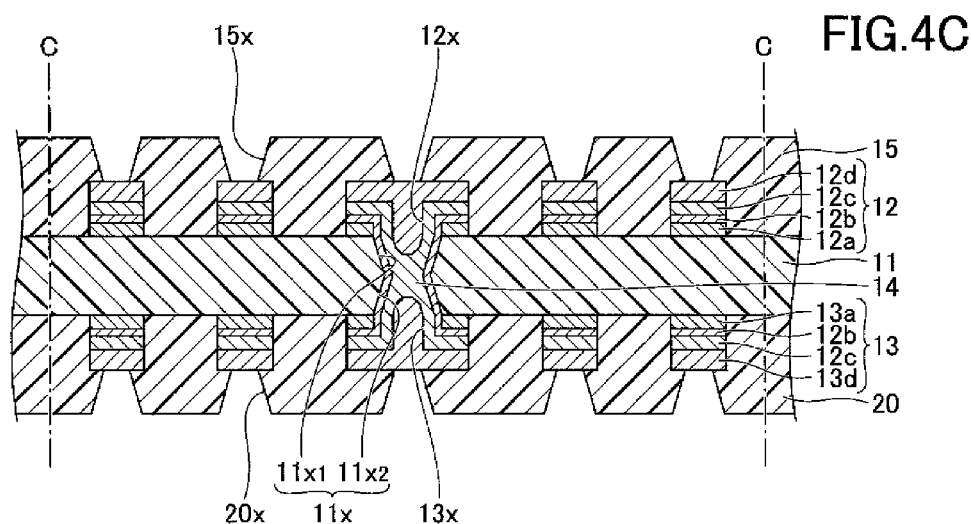

Then, in the process illustrated in FIG. 4C, the via hole 15x, which penetrates the insulating layer 15 and exposes the one surface of the wiring layer 12, is formed in the insulating layer 15. Further, the via hole 20x, which penetrates the insulating layer 20 and exposes the other surface of the wiring layer 13, is formed in the insulating layer 20. The via holes 15x, 20x may be formed by using, for example, a laser process method (e.g., $CO_2$ laser). After forming the via holes 15x, 20x, it is preferable to perform a desmearing process for removing residual resin adhered to the surfaces of the wiring layers 12, 13 exposed at the bottom parts of the via holes 15x, 20x.

Figure 5A:
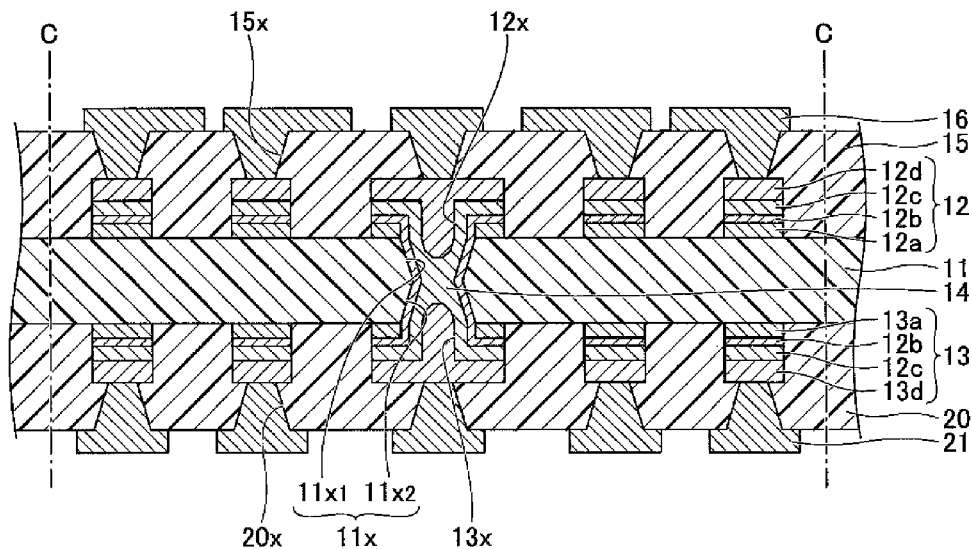

Then, in the process illustrated in FIG. 5A, the wiring layer 16 is formed toward the one side of the insulating layer 15. The wiring layer 16 is constituted by a via wiring filling the inside of the via hole 15x and a wiring pattern formed on the one surface of the insulating layer 15. The wiring layer 16 is electrically connected to the wiring layer 12 exposed at the bottom part of the via hole 15x.

Further, the wiring layer 21 is formed toward the other side of the insulating layer 20. The wiring layer 21 is constituted by a via wiring filling the inside of the via hole 20x and a wiring pattern formed on the other surface of the insulating layer 20. The wiring layer 21 is electrically connected to the wiring layer 13 exposed at the bottom part of the via hole 20x.

For example, copper (Cu) may be used as the material of each of the wiring layers 16, 21. The thickness of each of the wiring layers 16, 21 may be, for example, approximately 10 μm to 30 μm. Each of the wiring layers 16, 21 may be formed by using various wiring forming methods such as a semi-additive method or a subtractive method.

Figure 5B:
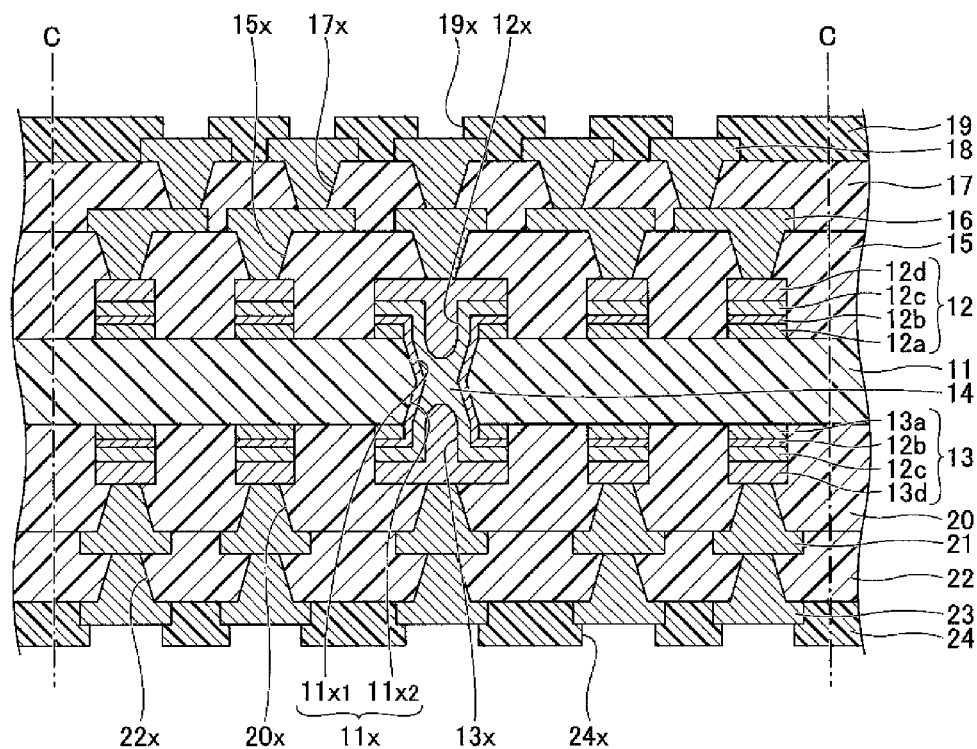

Then, in the process illustrated in FIG. 5B, the insulating layer 17, the wiring layer 18, and the solder resist layer 19 are formed on the wiring layer 16 in this order by repeating the processes illustrated in FIGS. 4B and 4C. Further, the insulating layer 22, the wiring layer 23, and the solder resist layer 24 are formed on the wiring layer 21 in this order by repeating the processes illustrated in FIGS. 4B and 4C. It is, however, to be noted that the number of wiring layers and insulating layers layered on the wiring layers 16, 21 may be arbitrarily changed.

That is, the insulating layer 17 is formed on the one surface of the insulating layer 15 and covers the wiring layer 16. Likewise, the insulating layer 22 is formed on the other surface of the insulating layer 20 and covers the wiring layer 21. Then, the via hole 17x, which penetrates the insulating layer 17 and exposes the one surface of the wiring layer 16, is formed. Likewise, the via hole 22x, which penetrates the insulating layer 22 and exposes the other surface of the wiring layer 21, is formed. For example, the material and thickness of each of the insulating layers 17, 22 may be the same as those of the insulating layer 15. Each of the insulating layers 17, 22 may include a filler such as silica ($SiO_2$).

Further, the wiring layer 18 is formed toward the one side of the insulating layer 17. The wiring layer 18 is constituted by a via wiring filling the inside of the via hole 17x and a wiring pattern formed on the one surface of the insulating layer 17. The wiring layer 18 is electrically connected to the wiring layer 16 exposed in the via hole 17x. Likewise, the wiring layer 23 is formed toward the other side of the insulating layer 22. The wiring layer 23 is constituted by a via wiring filling the inside of the via hole 22x and a wiring pattern formed on the other surface of the insulating layer 22. The wiring layer 23 is electrically connected to the wiring layer 21 exposed in the via hole 22x. For example, the material and the thickness of each of the wiring layers 18, 23 may be the same as those of the wiring layer 16.

Further, the solder resist layer 19 is formed on the one surface of the insulating layer 17 and covers the wiring layer 18. However, as described above, the solder resist layer 19 may be formed to expose the entire wiring layer 18. The solder resist layer 19 may be formed on the one surface of the insulating layer 17 and cover the wiring layer 18 by applying a liquid or paste-like photosensitive epoxy type insulating resin on the one surface of the insulating layer 17. The liquid or paste-like photosensitive epoxy type insulating resin may be applied by using, for example, a screen printing method, a roll coating method, or a spin coating method. Alternatively, the solder resist layer 19 may be formed on the one surface of the insulating layer 17 and cover the wiring layer 18 by laminating a film-like photosensitive epoxy type insulating resin on the one surface of the insulating layer 17. Likewise, the solder resist layer 24 is formed on the other surface of the insulating layer 22 and covers the wiring layer 23.

Then, the opening part 19x is formed on the solder resist layer 19 by exposing and developing the applied or laminated insulating resin (photolithographic method). Further, the opening part 24x is formed on the solder resist layer 24 by exposing and developing the applied or laminated insulating resin (photolithographic method). Alternatively, the opening parts 19x, 24x may be formed by using, for example, a laser processing method or a blasting method. The plan-view shape of each of the opening parts 19x, 24x may be, for example, a circular shape. The diameter of each of the opening parts 19x, 24x may be arbitrarily set to match with, for example, a semiconductor chip (not illustrated) or the pitch of the terminals of a motherboard (not illustrated).

According to necessity, a metal layer may be formed on the one surface of the wiring layer (first pad) 18 exposed in the bottom part of the opening part 19x by using, for example, an electroless plating method. Likewise, a metal layer may be formed on the other surface of the wiring layer (second pad) 23 exposed in the bottom part of the opening part 24x by using, for example, an electroless plating method. The metal layer may be, for example, a gold layer (Au), a nickel/gold (Ni/Au) layer (i.e. metal layer including a Ni layer and a Au layer layered in this order), or a nickel/palladium/gold (Ni/Pd/Au) layer (i.e. metal layer including a Ni layer, a Pd layer, and a Au layer layered in this order). Alternatively, instead of forming the metal layer, an anti-oxidation process (e.g., OSP (Organic Solderability Preservative)) may be performed on the one surface of the wiring layer 18 exposed in the opening part 19x and the other surface of the wiring layer 23 exposed in the opening part 24x.

Although the manufacturing of the wiring substrate 10 illustrated in FIG. 1 is completed by performing the processes illustrated in FIGS. 2A-5B, the processes illustrated in FIGS. 6A and 6B may be additionally performed. That is, in the process illustrated in FIG. 6A, an external connection terminal 50 is formed on the first pad 18 (or a metal layer or the like in a case where the metal layer or the like is formed on the first pad 18). The external connection terminal 50 may be, for example, a solder ball. The material of the solder ball may be, for example, an alloy including lead (Pb), an alloy including tin (Sn) and copper (Cu), an alloy including tin (Sn) and antimony (Sb), an alloy including tin (Sn) and silver (Ag), or an alloy including tin (Sn), silver (Ag), and copper (Cu).

In forming the external connection terminal (in this example, solder ball) 50, flux may be applied on, for example, the first pad 18 (or a metal layer or the like in a case where the metal layer or the like is formed on the first pad 18) as a surface treatment agent. Then, the solder ball 50 is mounted on the first pad 18 (or a metal layer or the like in a case where the metal layer or the like is formed on the first pad 18) and subjected to a reflow process in a temperature of approximately 240° C. to 260° C. Then, the flux is removed by cleaning the surface of the wiring substrate 10.

Then, the wiring substrate 10 is cut and singulated by, for example, dicing along a cutting area C (see FIG. 6A). Alternatively, the singulating of the wiring substrate 10 may be performed after the process illustrated in FIG. 5B.

Then, in the process illustrated in FIG. 6B, a semiconductor chip 60 is prepared. The semiconductor chip 60 is placed on the wiring substrate 10, so that the external connection terminals 50 of the wiring substrate 10 match the positions of corresponding electrode pads (not illustrated) of the semiconductor chip 60. Then, the wiring substrate 10 having the semiconductor chip 60 placed thereon is heated to a temperature of, for example, approximately 230° C., so that the solder constituting the external connection terminal (solder ball) 50 is melted. Thereby, the first pad 18 of the wiring substrate 10 can be electrically and mechanically connected to the electrode pad (not illustrated) of the semiconductor chip 60.

In a case where solder is formed on the electrode pad (not illustrated) of the semiconductor chip 60, the solder on the electrode pad (not illustrated) of the semiconductor chip 60 and the solder constituting the external connection terminal (solder ball) 50 are melted and become an alloy. Thereby, the solder on the electrode pad (not illustrated) of the semiconductor chip 60 and the solder constituting the external connection terminal (solder ball) 50 become a single bump. Then, an underfill resin 70 is supplied to fill in-between the wiring substrate 10 and the semiconductor chip 60. Thereby, manufacturing of a semiconductor package having the semiconductor chip 60 mounted on the wiring substrate 10 is completed.

Next, the effects attained by the above-described embodiment of the present invention are described with reference to the following processes for manufacturing a wiring substrate of a comparative example. In the description of the comparative example, like components are denoted with like reference numerals as of those of the above-described embodiment of the present invention and are not further explained. FIGS. 7A to 9B are schematic diagrams illustrating the processes for manufacturing the wiring substrate of the comparative example. First, the processes illustrated in FIGS. 2A-2C are performed. Then, in the process illustrated in FIG. 7A, a resist layer 200, which includes an opening part 200x corresponding to the wiring layer 12, is formed on the first metal layer 12Q toward the one surface of the core layer 11. Further, a resist layer 210, which includes an opening part 210x corresponding to the wiring layer 13, is formed on the first metal layer 12Q toward the other surface of the core layer 11.

Figure 7A:
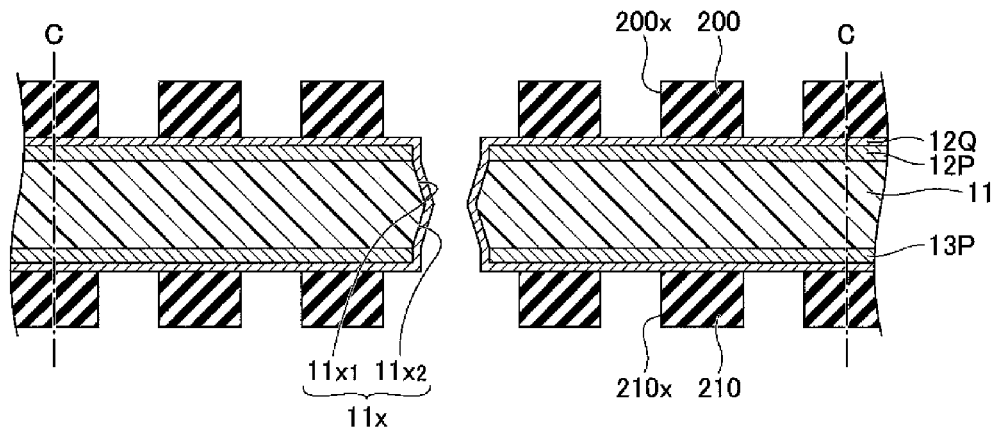
FIGS. 7A to 9B are schematic diagrams illustrating processes for manufacturing a wiring substrate of the comparative example.
Figure 7B:
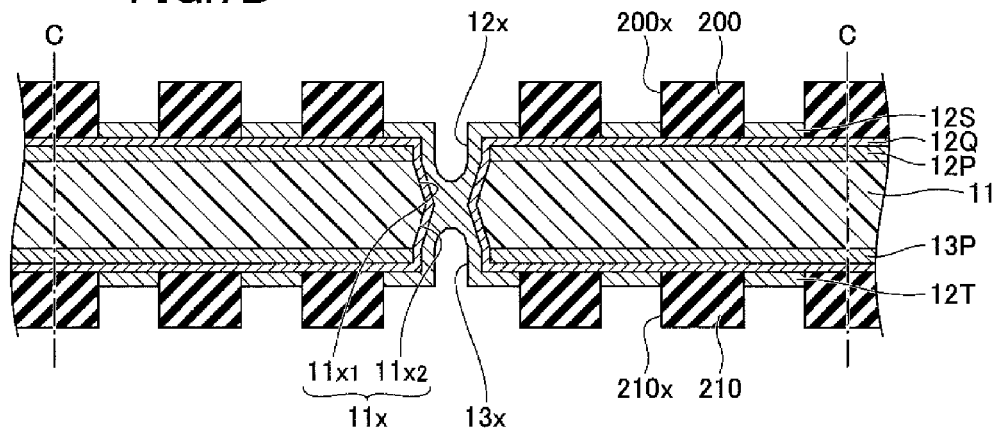

Then, in the process illustrated in FIG. 7B, a metal layer 12S is formed on the first metal layer 12Q exposed in the opening part 200x. The metal layer 12S is formed by an electroplating method using the first metal layer 12Q as a power-feeding layer. Further, a metal layer 12T is formed on the first metal layer 12Q exposed in the opening part 210x. The metal layer 12T is formed by an electroplating method using the first metal layer 12Q as a power-feeding layer. The metal layer 12S and the metal layer 12T form a united body inside the through-hole 11x and constitute a through-wiring together with the first metal layer 12Q formed in the through-hole 11x. The cross sections of the metal layers 12S, 12T in the through-hole 11x form an X-letter shape.

Figure 7C:
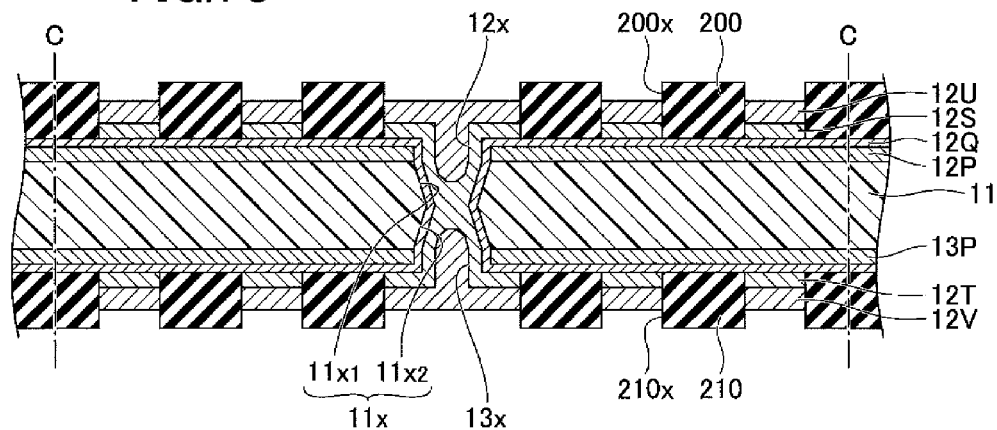
Figure 8A:
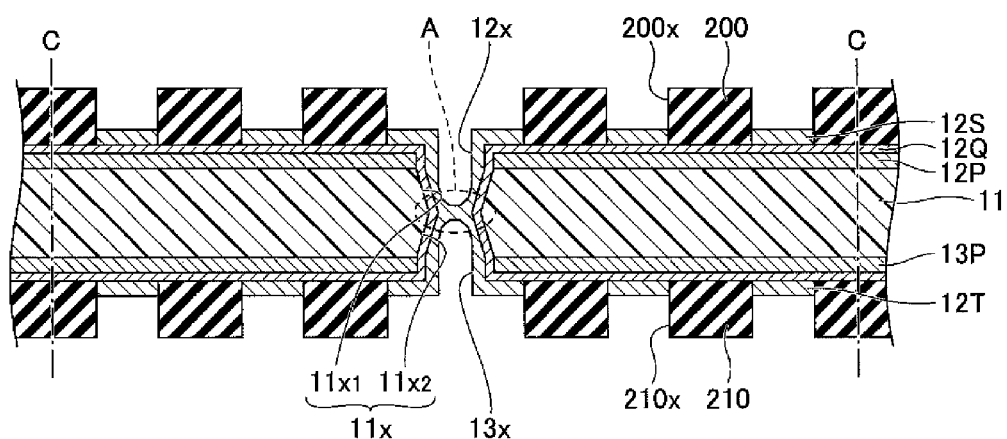
Figure 8B:
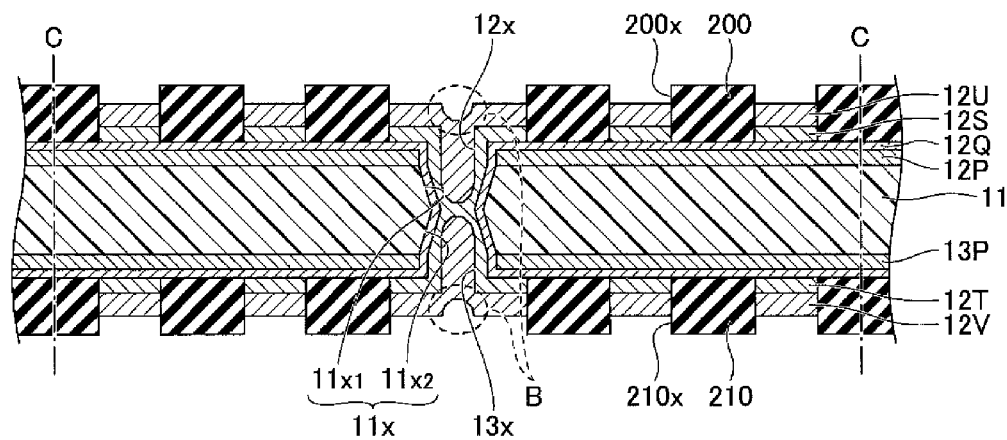

Then, in the process illustrated in FIG. 7C, a metal layer 12U is formed on the metal layer 12S exposed in the opening part 200x. The metal layer 12U is formed by an electroplating method using the first metal layer 12Q as a power-feeding layer. Further, a metal layer 12V is formed on the metal layer 12T exposed in the opening part 210x. The metal layer 12V is formed by an electroplating method using the first metal layer 12Q as a power-feeding layer.

The metal layer 12U fills a first recess part 12x formed toward a front surface of the through-hole 11x (toward the first metal foil 12P) in the process illustrated in FIG. 7B. Further, the metal layer 12V fills a second recess part 13x formed toward the front surface of the through-hole 11x (toward the second metal foil 13P) in the process illustrated in FIG. 7B. After the process of FIG. 7C, the resist layers 200, 210 are removed. Thereby, the wiring layers 12, 13 can be formed on the one and the other surfaces of the core layer 11. Although an electroplating method is used in the processes illustrated in FIGS. 7B and 7C, the conditions for performing the electroplating method (e.g., composition of a plating liquid used for the electroplating method) in each of the processes illustrated in FIGS. 7B and 7C may be changed. For example, the plating conditions for the process of FIG. 72 may be set by placing importance on appropriately filling the through-hole 11x, and the plating conditions for the process of FIG. 7C may be set by placing importance on attaining flatness for the metal layers 12U, 12V.

Because patterned metal layers 12S, 12T are formed in the process of FIG. 7B of the comparative example, distribution of current density may occur depending on the denseness/sparseness of the patterns to be formed. Therefore, in the process of FIG. 7B, the vicinity of the center part of the through-hole 11x may not be sufficiently closed up by the metal layers 12S, 12T as illustrated in part "A" of FIG. 8A. As a result, the first and second recess parts 12x, 13x formed in the through-hole 11x cannot be sufficiently filled with the metal layers 12U, 12V. Thus, recesses may remain in the metal layers 12U, 12V as illustrated in part "B" of FIG. 83.

Figure 9A:
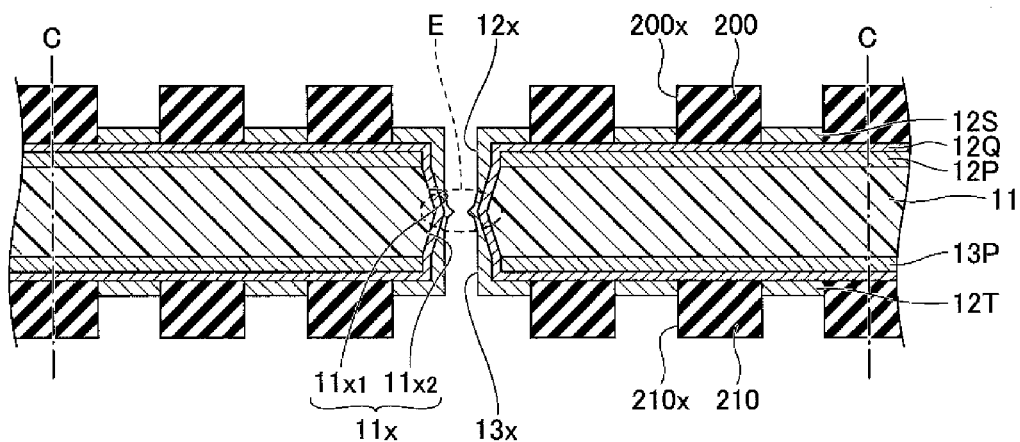
Figure 9B:
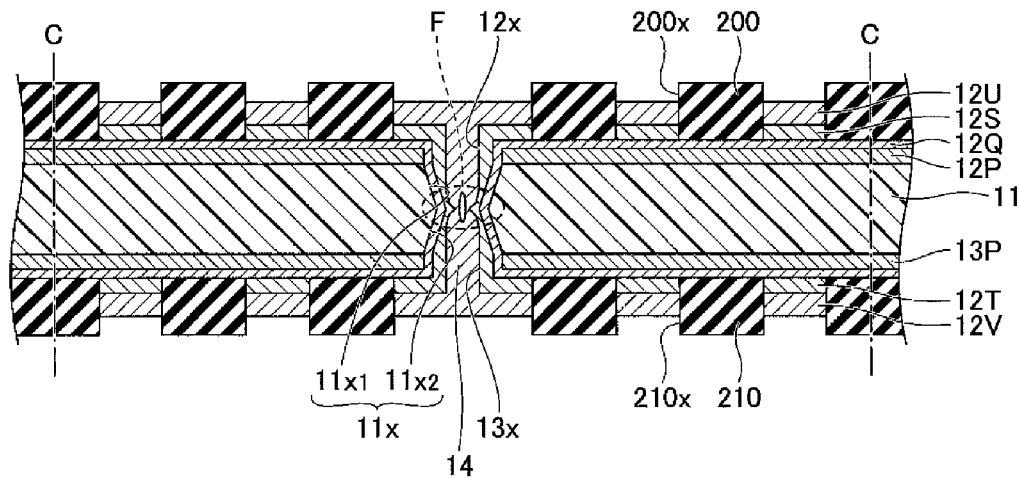

Further, in the process of FIG. 7B, the distribution of current density caused by the denseness/sparseness of the patterns to be formed may even lead to a case where the metal layers 12S, 12T do not close up the vicinity of the center part of the through-hole 11x at all, as illustrated in part "E" of FIG. 9A. As a result, in the process of FIG. 7C, voids may be created in the through-wiring 14 as illustrated in part "F" of FIG. 93.

Hence, distribution of current density, which is caused by the denseness/sparseness of the patterns to be formed, may occur when an X-letter shape metal layer is formed in the process of forming a patterned metal layer (i.e. forming a patterned metal layer simultaneously with forming an X-letter shape metal layer). Accordingly, a metal layer having an ideal X-letter shape cannot be formed. This may lead to a problem where the inside of a through-hole or a portion above the through-hole cannot be sufficiently filled with a metal layer in a subsequent process or a problem where voids are created in a through-wiring in a subsequent process. As a result, connection reliability of the wiring layer is degraded.

On the other hand, with the method for manufacturing a wiring substrate according to the above-described embodiment of the present invention, an X-letter shape metal layer is formed in a through-hole in a process (i.e. process illustrated in FIG. 3A) of forming an unpatterned uniform metal layer. Therefore, theoretically, distribution of current density due to denseness/sparseness of patterns would not occur. Thus, a metal layer having an ideal X-letter shape can be formed. Accordingly, there can be prevented a problem where a vicinity of a center part of an X-letter shape metal layer in a through-hole is not or only partly closed up by the metal layer. Hence, there can be prevented the problem where the inside of a through-hole or a portion above the through-hole cannot be sufficiently filled with a metal layer in a subsequent process. Further, there can be prevented a problem where voids are created in a through-wiring in a subsequent process. Accordingly, a wiring layer having high connection reliability can be formed.

Further, with the method for manufacturing a wiring substrate according to the above-described embodiment of the present invention, patterning using a semi-additive method can be used unlike the method described above in the background. As a result, a fine-pitched wiring layer can be formed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, although the through-hole formed in the core layer of the wiring substrate according above-described embodiment has a shape in which the peak parts of two circular truncated shaped holes communicate with each other, the present invention may be applied to a wiring substrate having a single circular cylindrical shaped through-hole formed in a core layer thereof. Even in the case of using the wiring substrate having the single circular cylindrical shaped through-hole formed in the core layer, the wiring substrate can attain the same effects attained by the wiring substrate of the above-described embodiment. It is to be noted that a drilling process may be used to form the single circular cylindrical shaped through-hole.

Further, according to the above-described embodiment, the through-hole is formed in a core layer having metal foils formed on both surfaces of the core layer. However, the through-hole may be formed in a core layer that does not have metal foils formed on both surfaces of the core layer by using, for example, a laser process or a drilling process. In this case, the first metal layer is formed, so that the one and the other surfaces of the core layer and the inner wall surface of the through-hole are coated by the first metal layer. Other than the first metal layer, the metal layers are similarly formed as those of the above-described embodiment.

What is claimed is:

1. A wiring substrate comprising:
   a core layer having one surface and another surface and including a through-hole penetrating the core layer from the one surface to the other surface of the core layer, wherein an inner wall surface of the through-hole extends continuously from the one surface of the core layer to the other surface of the core layer;
   a first metal layer formed directly on the inner wall surface of the through-hole, the first metal layer covering the entire inner wall surface of the through-hole and continuously extending from the one surface of the core layer to the other surface of the core layer;
   a second metal layer formed on the first metal layer;
   a third metal layer formed on the second metal layer toward the one surface of the core layer;
   a fourth metal layer formed on the second metal layer toward the other surface of the core layer;

a first wiring layer formed toward the one surface of the core layer and including a first part of the first metal layer, a first part of the second metal layer, and the third metal layer that are formed toward the one surface of the core layer;

a second wiring layer formed toward the other surface of the core layer and including a second part of the first metal layer, a second part of the second metal layer, and the fourth metal layer that are formed toward the other surface of the core layer; and a through-wiring formed in the through-hole and including a third part of the first metal layer, a third part of the second metal layer, a part of the third metal layer, and a part of the fourth metal layer that are formed in the through-hole;

wherein, among the first, second, third, and fourth metal layers, only the first metal layer and the second metal layer are formed in a narrowest part of the through-hole, wherein the core layer and the inner wall surface of the through-hole are formed of an insulating resin, wherein the second metal layer covers the first metal layer in the through-hole and closes up the narrowest part of the through-hole, wherein a thickness of a part of the third metal layer that is formed on top of the one surface of the core layer is greater than a thickness of a part of the second metal layer that is formed on top of the one surface of the core layer, and wherein a thickness of a part of the fourth metal layer that is formed on top of the other surface of the core layer is greater than a thickness of a part of the second metal layer that is formed on top of the other surface of the core layer.

2. The wiring substrate as claimed in claim 1,
wherein the through-hole includes a first hole and a second hole,
wherein each of the first and second holes has a circular truncated shape,
wherein the first hole includes a first opening part toward the one surface of the core layer and a first peak part in the core layer, the first opening part having an area larger than an area of the first peak part,
wherein the second hole includes a second opening part toward the other surface of the core layer and a second peak part in the core layer, the second opening part having an area larger than an area of the second peak part,
wherein the first peak part and the second peak part are formed in communication with each other in the core layer.

3. The wiring substrate as claimed in claim 1,
wherein the one surface of the core layer has a first metal foil formed thereon,
wherein the other surface of the core layer has a second metal foil formed thereon,
wherein the through-hole penetrates the first metal foil, the core layer, and the second metal foil,
wherein the first metal layer is formed on the first and second metal foils,
wherein the first wiring layer further includes a part of the first metal foil formed toward the one surface of the core layer,
wherein the second wiring layer further includes a part of the second metal foil formed toward the other surface of the core layer.

4. The wiring substrate as claimed in claim 3,
wherein a part of the one surface of the core layer that is exposed from the first metal foil has an annular shape, and
wherein a part of the other surface of the core layer that is exposed from the second metal foil has an annular shape.

5. The wiring substrate as claimed in claim 4, wherein the first metal layer is provided to cover the exposed part of the one surface of the core layer and the exposed part of the other surface of the core layer.

6. The wiring substrate as claimed in claim 3, wherein an oxide film having a roughened surface is formed on a surface of the first metal foil and a surface of the second metal foil.

7. The wiring substrate as claimed in claim 1,
wherein the through-hole includes a first recess part having an opening toward the one surface of the core layer and a second recess part having an opening toward the other surface of the core layer,
wherein the second metal layer closing up the narrowest part of the through-hole serves as a bottom part of each of the first and second recess parts,
wherein the third metal layer fills the first recess part,
wherein the fourth metal layer fills the second recess part.

8. The wiring substrate as claimed in claim 1, wherein the core layer includes an insulating resin impregnated in a woven or non-woven fiber.

9. The wiring substrate as claimed in claim 1,
wherein the each of the second metal layer, the third metal layer, and the fourth metal layer has a first surface and a second surface,
wherein a distance between the first surface and the second surface of the second metal layer is a thickness of the second metal layer,
wherein a distance between the first surface and the second surface of the third metal layer is a thickness of the third metal layer,
wherein a distance between the first surface and the second surface of the fourth metal layer is a thickness of the fourth metal layer,
wherein each of the third metal layer and the fourth metal layer has a layered part that is parallel to the one surface and the another surface of the core layer and orthogonal to a central axis of the through-hole,
wherein each of the thicknesses of the third metal layer and the fourth metal layer is greater than the thickness of the second metal layer at least at the layered part.

10. A wiring substrate comprising:
a core layer having one surface and another surface and including a through-hole penetrating the core layer from the one surface to the other surface of the core layer, wherein an inner wall surface of the through-hole extends continuously from the one surface of the core layer to the other surface of the core layer;
a first metal layer formed directly on the inner wall surface of the through-hole, the first metal layer covering the entire inner wall surface of the through-hole and continuously extending from the one surface of the core layer to the other surface of the core layer;
a second metal layer formed on the first metal layer;
a third metal layer formed on the second metal layer toward the one surface of the core layer;
a fourth metal layer formed on the second metal layer toward the other surface of the core layer;
a first wiring layer formed toward the one surface of the core layer and including a first part of the first metal layer, a first part of the second metal layer, and the third metal layer that are formed toward the one surface of the core layer;

a second wiring layer formed toward the other surface of the core layer and including a second part of the first metal layer, a second part of the second metal layer, and the fourth metal layer that are formed toward the other surface of the core layer; and a through-wiring formed in the through-hole and including a third part of the first metal layer, a third part of the second metal layer, a part of the third metal layer, and a part of the fourth metal layer that are formed in the through-hole;

wherein, among the first, second, third, and fourth metal layers, only the first metal layer and the second metal layer are formed in a narrowest part of the through-hole, wherein the core layer and the inner wall surface of the through-hole are formed of an insulating resin, wherein the second metal layer covers the first metal layer in the through-hole and closes up the narrowest part of the through-hole, wherein the one surface of the core layer has a first metal foil formed thereon, wherein the other surface of the core layer has a second metal foil formed thereon, wherein the through-hole penetrates the first metal foil, the core layer, and the second metal foil, wherein the first metal layer is formed on the first and second metal foils, wherein the first wiring layer further includes a part of the first metal foil formed toward the one surface of the core layer, wherein the second wiring layer further includes a part of the second metal foil formed toward the other surface of the core layer, wherein a part of the one surface of the core layer that is exposed from the first metal foil has an annular shape, wherein a part of the other surface of the core layer that is exposed from the second metal foil has an annular shape, wherein a thickness of a part of the third metal layer that is formed on top of the one surface of the core layer is greater than a thickness of a part of the second metal layer that is formed on top of the one surface of the core layer, and wherein a thickness of a part of the fourth metal layer that is formed on top of the other surface of the core layer is greater than a thickness of a part of the second metal layer that is formed on top of the other surface of the core layer.

11. The wiring substrate as claimed in claim 10, wherein the first metal layer is provided to cover the exposed part of the one surface of the core layer and the exposed part of the other surface of the core layer.

12. The wiring substrate as claimed in claim 10, wherein an oxide film having a roughened surface is formed on a surface of the first metal foil and a surface of the second metal foil.

13. The wiring substrate as claimed in claim 10,
wherein the through-hole includes a first recess part having an opening toward the one surface of the core layer and a second recess part having an opening toward the other surface of the core layer,
wherein the second metal layer closing up the narrowest part of the through-hole serves as a bottom part of each of the first and second recess parts,
wherein the third metal layer fills the first recess part, and
wherein the fourth metal layer fills the second recess part.

14. The wiring substrate as claimed in claim 10,
wherein the through-hole includes a first hole and a second hole,
wherein each of the first and second holes has a circular truncated shape,
wherein the first hole includes a first opening part toward the one surface of the core layer and a first peak part in the core layer, the first opening part having an area larger than an area of the first peak part,
wherein the second hole includes a second opening part toward the other surface of the core layer and a second peak part in the core layer, the second opening part having an area larger than an area of the second peak part, and
wherein the first peak part and the second peak part are formed in communication with each other in the core layer.

15. The wiring substrate as claimed in claim 10, wherein the core layer includes an insulating resin impregnated in a woven or non-woven fiber.

16. The wiring substrate as claimed in claim 10,
wherein the each of the second metal layer, the third metal layer, and the fourth metal layer has a first surface and a second surface,
wherein a distance between the first surface and the second surface of the second metal layer is a thickness of the second metal layer,
wherein a distance between the first surface and the second surface of the third metal layer is a thickness of the third metal layer,
wherein a distance between the first surface and the second surface of the fourth metal layer is a thickness of the fourth metal layer,
wherein each of the third metal layer and the fourth metal layer has a layered part that is parallel to the one surface and the another surface of the core layer and orthogonal to a central axis of the through-hole, and
wherein each of the thicknesses of the third metal layer and the fourth metal layer is greater than the thickness of the second metal layer at least at the layered part.

* * * * *